(12) United States Patent
Gavillet

(10) Patent No.: US 9,318,681 B2
(45) Date of Patent: Apr. 19, 2016

(54) THERMOGENERATOR COMPRISING PHASE-CHANGE MATERIALS

(75) Inventor: Jerome Gavillet, Saint Egreve (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 608 days.

(21) Appl. No.: 13/806,392

(22) PCT Filed: Jun. 22, 2011

(86) PCT No.: PCT/EP2011/060456
§ 371 (c)(1),
(2), (4) Date: Dec. 21, 2012

(87) PCT Pub. No.: WO2011/161167
PCT Pub. Date: Dec. 29, 2011

(65) Prior Publication Data
US 2013/0098417 A1 Apr. 25, 2013

(30) Foreign Application Priority Data
Jun. 23, 2010 (FR) ...................................... 10 55005

(51) Int. Cl.
| | | |
|---|---|---|
| *H01L 35/00* | (2006.01) | |
| *H01L 35/30* | (2006.01) | |
| *H01L 35/28* | (2006.01) | |

(Continued)

(52) U.S. Cl.
CPC ............ *H01L 35/28* (2013.01); *H01L 23/4275* (2013.01); *H01L 35/30* (2013.01); *H01L 2924/0002* (2013.01)

(58) Field of Classification Search
CPC .................. H01L 2924/00; H01L 2924/0002; H01L 35/00; H01L 35/28; H01L 35/30; H01L 45/06; H01L 31/0203; H01L 31/052; H01L 23/4275
USPC .................................. 136/201, 205, 206, 207
See application file for complete search history.

(56) References Cited

U.S. PATENT DOCUMENTS 5,761,909 A * 6/1998 Hughes .................. F25B 21/02
165/DIG. 9
6,291,760 B1 * 9/2001 Mitamura ............... H01L 35/00
136/205

(Continued)

FOREIGN PATENT DOCUMENTS

| CN | 1254111 A | 5/2000 |
|---|---|---|
| CN | 1892206 A | 1/2007 |

(Continued)

OTHER PUBLICATIONS

International Search Report Issued Jul. 29, 2011 in PCT/EP11/60456 Filed Jun. 22, 2011.

(Continued)

*Primary Examiner* — Jayne Mershon
*Assistant Examiner* — Mayla Gonzalez Ramos
(74) *Attorney, Agent, or Firm* — Oblon, McClelland, Maier & Neustadt, L.L.P.

(57) ABSTRACT

A thermogenerator including at least one thermoelement and two phase-change materials having different phase-change temperatures, the at least one thermoelement having two opposite main faces, and each of the faces is covered by one of the phase-change materials, such that the thermoelement is subject only to a temperature gradient imposed by the two phase-change materials, during a phase of heating or cooling.

16 Claims, 3 Drawing Sheets

Figure 1:
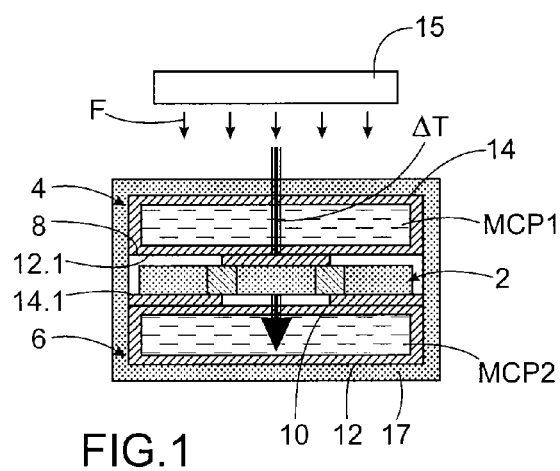

(51) Int. Cl.
*H01L 35/34* (2006.01)
*H01L 23/427* (2006.01)

(56) References Cited

U.S. PATENT DOCUMENTS

| | | |
|---|---|---|
| 7,262,360 B1 | 8/2007 | Davis |
| 7,445,385 B2 | 11/2008 | Lin |
| 2003/0062150 A1 | 4/2003 | Sweitzer et al. |
| 2003/0143958 A1 | 7/2003 | Elias et al. |
| 2004/0128041 A1 | 7/2004 | Hiller et al. |
| 2004/0238022 A1 | 12/2004 | Hiller et al. |
| 2005/0040388 A1 | 2/2005 | Ghamaty et al. |
| 2007/0006995 A1 | 1/2007 | Lin |
| 2008/0168775 A1 | 7/2008 | Windheim et al. |
| 2008/0257395 A1 | 10/2008 | Jovanovic et al. |
| 2010/0006132 A1 | 1/2010 | Hodes |
| 2011/0016886 A1 * | 1/2011 | Ghoshal .................. F25B 21/02 62/3.2 |
| 2013/0312935 A1 | 11/2013 | Gavillet |
| 2014/0158334 A1 | 6/2014 | Dellea et al. |
| 2014/0369005 A1 | 12/2014 | Gavillet et al. |

FOREIGN PATENT DOCUMENTS

| | | |
|---|---|---|
| CN | 201212878 Y | 3/2009 |
| EP | 1 001 470 A1 | 5/2000 |
| JP | 11-187682 A | 7/1999 |
| JP | 2005-269738 A | 9/2005 |
| JP | 2009-247050 A | 10/2009 |
| JP | 2009247050 A * | 10/2009 |
| JP | 2011-528189 A | 11/2011 |
| WO | WO 02/17471 A1 | 2/2002 |

OTHER PUBLICATIONS

Combined Office Action and Search Report issued Apr. 1, 2015 in Chinese Patent Application No. 201180040595.8 (with English translation of categories of cited documents).

Office Action issued May 18, 2015 in Japanese Patent Application No. 2013-515888 (with English language translation).

Preliminary Search Report issued Jan. 5, 2011 in French Patent Application No. 1055005 filed Jun. 23, 2013.

Ravi Kandasamy, et al. "Transient cooling of electronics using phase change material (PCM)-based heat sinks", Applied Thermal Engineering, vol. 28, 2008, pp. 1047-1057.

M.J. Huang, et al. "Phase change materials for limiting temperature rise in building integrated photovoltaics", Solar Energy, vol. 80, 2006, pp. 1121-1130.

\* cited by examiner

THERMOGENERATOR COMPRISING PHASE-CHANGE MATERIALS

TECHNICAL FIELD AND PRIOR ART

The present invention relates to a thermogenerator using phase-change materials, and more generally to a source of thermoelectric energy.

The term "thermoelectric effect" designates the appearance of a difference of potential at the junction of two conductive materials of different natures subjected to a temperature difference; this effect is also called the Seebeck effect.

The best-known use of the Seebeck effect is to measure temperature using thermocouples.

Hitherto, thermoelectric conversion systems or thermoelectric sources to generate electricity from heat have been confined to niche markets due to their low levels of efficiency and their high costs.

In the case of an environment in which the temperature is usually strictly uniform, the system is not subject to a temperature gradient in continuous fashion. An electric battery must then be provided to store the generated current, when a temperature gradient appears. Electricity generation is consequently subject to events which are not controlled.

In addition, in the case of independent systems, i.e. systems not linked to a device for controlling the temperature difference, the temperature difference fluctuates, and does not allow constant generation of voltage and current. This is particularly problematic in the case of a power supply of a battery, which is intolerant of voltage variations at its terminals.

Document EP 1 001 470 describes a wristwatch powered by a thermoelectric element. There may be two elements comprising phase-change materials. In the described arrangement, and in the described operation, the thermal gradient cannot be controlled within the thermoelectric element such that it is constant over a given period, and that the thermoelectric element delivers stable electrical power.

One aim of the present invention is consequently to provide a thermogenerator using phase-change materials, for which the generation of stable electrical power is controlled.

DESCRIPTION OF THE INVENTION

The aim set out above is achieved through a thermogenerator comprising at least one thermoelement and two elements comprising phase-change materials, having different phase-change temperatures, where the elements comprising phase-change materials are positioned either side of the thermoelement such that the latter is subject only to the temperature gradient imposed by the two elements comprising phase-change materials. Thus, when one of the elements comprising phase-change materials consists both of a liquid phase and of a solid phase, it is at a constant temperature. The temperature gradient through the thermoelement is consequently constant. The thermoelement is then able to deliver stable electrical power.

In other words, the elements comprising phase-change materials and the thermoelement are arranged thermally in series, i.e. the thermoelement is therefore subjected solely to the temperatures of the two elements comprising phase-change materials.

It is sought to deliver a constant thermal power value to the thermoelement, which presupposes a constant temperature gradient, since all the other parameters are already constant.

The elements comprising phase-change materials are arranged on both faces of the thermoelement, such that these faces are completely subject to the temperatures of the phase-change material.

In a particularly advantageous manner, it may be decided to implement thermal short-circuits between the two phase-change materials, in order to extend the period during which the temperature gradient through the thermoelement is constant, in the fusion phase. These thermal short-circuits can be implemented by a fluid communication between the elements comprising phase-change materials, causing the premature appearance of a liquid nucleus in the phase-change material not directly subject to the heat source. Connections are made between the tanks of phase-change materials in order rapidly to create the appearance of a nucleus in the material which is least exposed, and to extend the period during which the temperature is constant.

In another particularly advantageous manner, areas may be comprised in which solidification is delayed, enabling the period during which the temperature gradient is constant to be extended, in the solidification phase. To accomplish this, an area is comprised in which the thickness of the phase-change material is greater than the melt front distance.

The subject-matter of the present invention is then a thermogenerator comprising at least one thermoelement and two phase-change materials having different phase-change temperatures, where said at least one thermoelement has two opposite main faces, and where each of said faces is covered by one of the phase-change materials, such that the thermoelement is subject only to the temperature gradient imposed by the two phase-change materials, during a phase of heating or cooling.

In an example embodiment the thermogenerator comprises enclosures containing the phase-change materials, where each enclosure has a first and a second part, where the first part comprises a flat plate, one face of which is fitted with protruding fins, and where the second part comprises a flat plane, one face of which is in contact with the thermoelement, and the other face of which is fitted with protruding fins, where the first and second parts are installed facing one another, such that the fins interpenetrate, defining a cavity in which the phase-change material is present.

Advantageously, the thickness of the phase-change material in at least a proportion of each of the enclosures is of the order of, and preferably slightly less than or equal to, the melt front distance, where the melt front distance is equal to $$\sqrt{\frac{2 \cdot k \cdot \Delta T \cdot t}{L}},$$

where k is the thermal conduction of the phase-change material, L is the latent heat of fusion of the phase-change material, $\Delta T$ is the temperature difference between the temperature of the wall of the fin and the phase-change temperature of the phase-change material, and t is the time.

In a particularly advantageous manner, the thermogenerator according to the present invention comprises means to put the two phase-change materials into direct contact.

Said means to put the two phase-change materials into direct contact can comprise at least one duct linking an enclosure in which the first phase-change material is present and an enclosure in which the second phase-change material is present, where said duct is partially filled by the first phase-change material and by the second phase-change material.

In a preferred manner, the transverse dimension of the duct is less than or equal to the melt front distance, where the melt front distance is equal to $$\sqrt{\frac{2 \cdot k \cdot \Delta T \cdot t}{L}},$$

where k is the thermal conduction of the phase-change material, L is the latent heat of fusion the phase-change material, $\Delta T$ is the temperature difference between the temperature of the wall of the duct and the phase-change temperature of the phase-change material, and t is the time.

According to a preferred embodiment of the invention, the transverse dimension of the duct is very much less than the melt front distance, representing for example only 0.01 to 50% of this distance, or even 0.1 to 20%.

The duct may be made of a material providing satisfactory thermal conductivity, i.e. a material the thermal conductivity of which is greater than that of the MCP [Phase-Change Materials] used in the invention.

For example, the duct may be made of aluminium, steel, copper or stainless steel.

Advantageously, a central portion of the duct is made of a material having limited thermal conductivity, i.e. the thermal conductivity of which is less than that of the phase-change materials.

For example, said portion of the duct may be made of glass or plastic.

It may be decided for at least a volume of liquid to separate the first and second phase-change materials in said duct.

In an equally particularly advantageous manner, the enclosure containing the phase-change material having the higher phase-change temperature has an area of phase-change material the thickness of which is greater than the melt front distance.

This may be obtained by ensuring that the distance between two fins locally is greater than the melt front distance. As a variant, the enclosure may comprise an added tank containing phase-change material, where the transverse dimension of said tank is greater than the melt front distance.

The thermogenerator according to the invention is preferably surrounded by thermal insulation means to guide the heat flux through the stack formed by the phase-change materials and the at least one thermoelement.

Another object of the present invention is an electricity generating system comprising a thermogenerator according to the present invention and a heat source.

The heat source may be positioned on the side of the enclosure containing the phase-change material having the higher phase-change temperature.

In another example embodiment the electricity generating system according to the invention may comprise a closed fluid circuit, containing a heat-transfer fluid, where said circuit is able to exchange heat with the first and second phase-change materials, and traverses the heat source, in which the heat source is located downstream from the phase-change material having the lower phase-change temperature, and upstream from the phase-change material having the higher phase-change temperature in the direction of flow of the heat transfer fluid, and in which, when the heat transfer fluid exchanges with the phase-change material having the lower phase-change temperature, its temperature is at least equal to the phase-change temperature of said material, and when the heat transfer fluid exchanges heat with the phase-change material having the higher phase-change temperature, its temperature is at least equal to the phase-change temperature of said material.

The heat source is, for example, formed by at least one integrated circuit.

BRIEF DESCRIPTION OF THE ILLUSTRATIONS

Figure 2A:
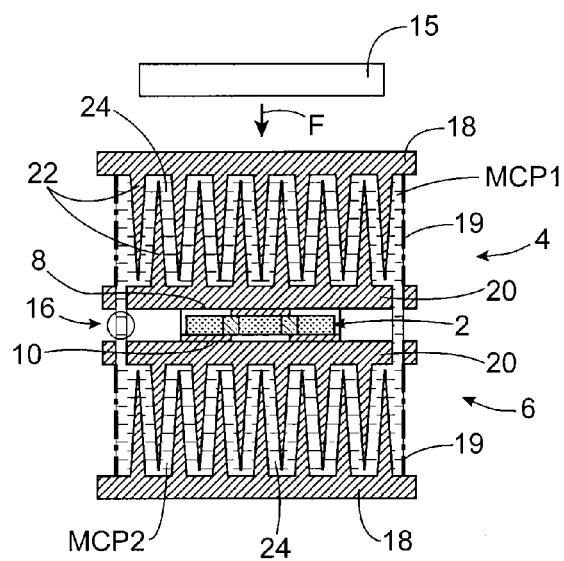
Figure 2B:
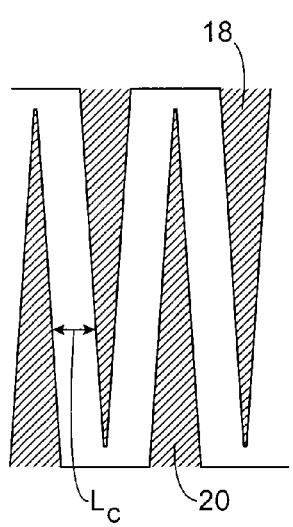
Figure 3A:
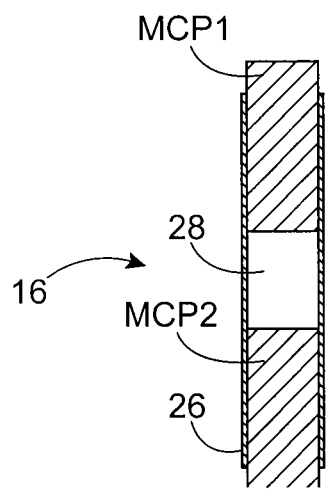
Figure 3B:
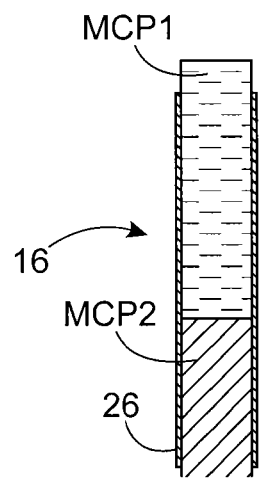
Figure 3C:
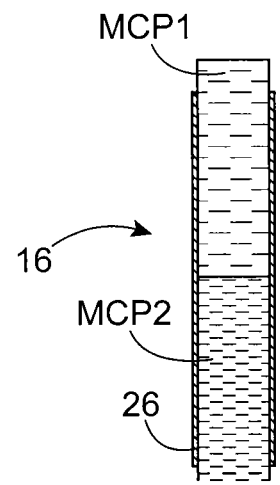
Figure 4A:
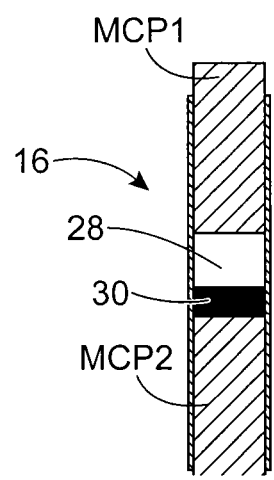
Figure 4B:
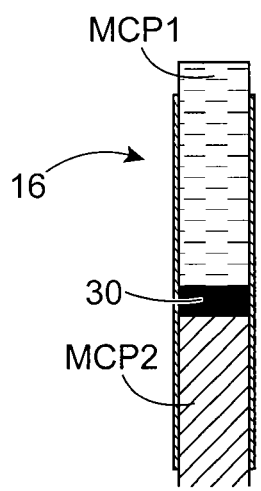
Figure 4C:
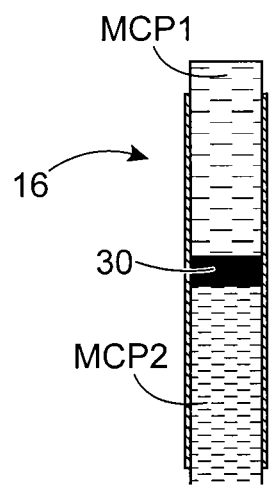
Figure 5:
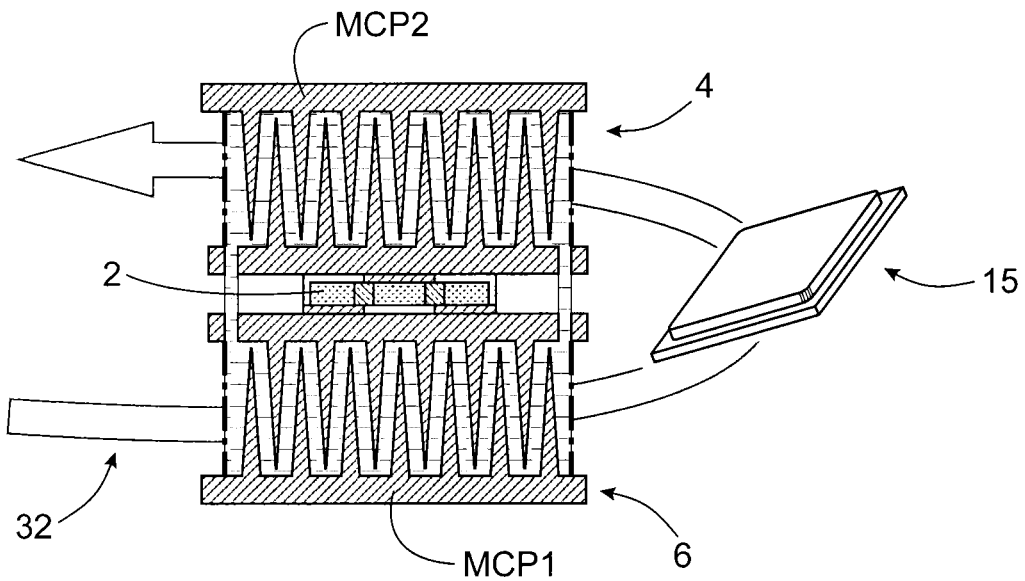
Figure 6:
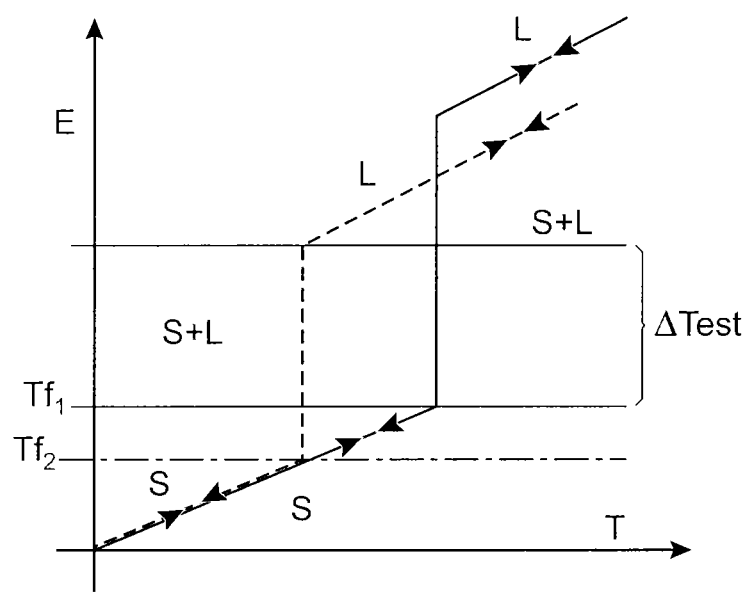

The present invention will be better understood by means of the description which follows and the appended illustrations, in which:

FIG. 1 is a schematic representation of a thermogenerator according to the present invention, FIG. 2A is a schematic representation of a practical example embodiment of a thermogenerator according to the present invention having thermal short-circuits between the two phase-change materials, FIG. 2B is a detailed view of FIG. 2A, FIGS. 3A to 3C are detailed views of FIG. 2A showing a thermal short-circuit in different states, FIGS. 4A to 4C are views of a variant embodiment of a thermal short-circuit in different states, FIG. 5 is a schematic representation of an electricity generating system comprising a thermogenerator according to the present invention, associated with a fluid circuit, FIG. 6 is a graphical representation of changes in the energy stored or released in the phase-change materials as the temperature changes.

DETAILED ACCOUNT OF PARTICULAR EMBODIMENTS

In FIG. 1 a schematic representation of a thermogenerator according to the present invention can be seen comprising a thermoelement 2 and first and second elements 4, 6, each containing a phase-change material MCP1, MCP2. In the remainder of the description the phase-change materials will be designated by "MCP1 material" and "MCP2 material".

Thermoelement 2 has two opposite faces 8, of larger areas. Each of faces 8, 10 is in contact with one of elements 4, 6 comprising phase-change materials.

First and second elements 4, 6 comprising phase-change materials fully cover both faces 8, 10 of thermoelement 2.

Each of the first and second elements 4, 6 comprising phase-change materials has an enclosure 12, 14 having a face 12.1, 14.1 in contact with a face 8, of thermoelement 2, and the MCP1, MCP2 material in enclosure 12, 14.

The thermogenerator is advantageously surrounded by a thermal insulator 17 guiding the heat flux along the axis of the stack, and also reducing the heat losses towards the outside.

According to the invention, the MCP1, MCP2 materials have different solid-liquid phase-change temperatures $T_{f1}$, $T_{f2}$.

The MCP1 material has the higher melting point and is intended to be positioned on the side of a heat source 15. This heat source may be an integrated circuit of a computer, a photovoltaic cell, a thermal solar component, a power electronic component such as an IGBT (Insulated Gate Bipolar Transistor), a microelectronic component such as a microprocessor, etc.

The term "thermoelement" designates any device able to generate electrical power when it is subject to a temperature gradient.

For example, thermoelement 2 comprises a substrate and one or more P-N junctions connected in series. The P-N junctions are formed by an N-doped semiconductor material and a P-doped semiconductor material. The materials are positioned in alternating fashion, and extend between the two faces 8, 10 of the thermoelement. Interconnections are made between the N-doped materials and the adjacent P-doped materials so as to form the P-N junctions. Both materials of a P-N junction are therefore subject to the same heat flux imposed by the MCP1 and MCP2 materials. The P-N junctions are connected electrically in series.

The materials of the P-N junctions are separated by the substrate, which is chosen such that it is an electrical insulator to prevent the electrical short-circuiting of the P-N junctions, and such that it is a satisfactory thermal insulator to prevent a thermal short-circuit between the MCP1 material and the MCP2 material. The substrate may, for example, be made of a flexible polymer, a ceramic or a metal. The polymer used can be a thermosetting polymer.

Voltage ΔV at the terminals of the module is dependent on the number of P-N junctions; the higher this number the higher the voltage.

The connection between the N-doped materials and the P-doped materials and the interconnections between the P-N junctions are made, for example, of copper.

The MCP1 material has a phase-change temperature T1; it imposes temperature T1 on face 8 of the thermoelement and face 10 of the thermoelement is at the temperature of the MCP2 material $T_2$.

The difference ΔT=T+T2 causes a voltage ΔV to appear at the terminals of thermoelectric module 2.

The Seebeck effect results in the following relationship:

$$\Delta V = \Delta T \cdot S$$

where

ΔV is the potential difference in Volts at the terminals of the thermoelectric module, ΔT is the temperature gradient in ° C. in the P-N junctions, S is the Seebeck coefficient in $V \cdot K^{-1}$.

Thus, the higher the imposed temperature gradient ΔT, the greater the potential difference ΔV generated by the thermogenerator.

The value of ΔT is chosen according to the desired power value; for example, if a power value of several hundred milliwatts is desired a temperature difference ΔT of 20° C. is sufficient. If a power value of several watts is sought a temperature difference of several hundred ° C. is required.

When heat is contributed by the heat source the phase-change materials gradually change from a solid state to a liquid state, the liquid being confined in the enclosure.

Thermoelement 2 is then subject to a temperature gradient between its first face 8 and its second face. The elements comprising phase-change materials form a thermal buffer between the heat source and the thermoelement, on the one hand, and in the rear face of the thermoelement, on the other hand, and by this means impose a thermal gradient on the thermoelement.

In FIG. 6 the changes in the stored energy and the released energy E are shown as a function of temperature T for both the MCP1 and MCP2 materials. The energy changes of the MCP1 material are represented with a solid line, and those of MCP2 with a dashed line. Reference S designates the solid phase alone, reference L designates the liquid phase alone, and reference S+L the blend of the liquid phase and solid phase.

Each of the MCP1, MCP2 materials has constant temperatures $T_{f1}$, $T_{f2}$ for as long as a solid phase and a liquid phase coexist. These periods are represented by the vertical lines in FIG. 6.

The area designated ΔTcst during which both phase-change materials are simultaneously at constant temperatures $T_{f1}$, $T_{f2}$ is delimited by the uninterrupted horizontal lines. This is the period which allows stable electrical power to be generated.

According to the present invention, the thermoelement is subject only to the temperature gradient imposed by the two phase-change materials MCP1, MCP2. During the period in which the two materials MCP1, MCP2 are at constant temperatures $T_{f1}$, $T_{f2}$, the temperature gradient to which thermoelement 2 is subject is consequently constant. The thermogenerator can then generate stable electrical power.

By virtue of the invention it is then easy, using phase-change materials, to generate stable power from a heat source.

In FIGS. 2A and 2B a particularly advantageous embodiment of a thermogenerator according to the present invention can be seen, providing extended periods of generation of stable electrical power.

The references used for FIG. 1 will be used to designate the same elements in FIG. 2A.

This embodiment differs from that of FIG. 1, notably in that the thermogenerator comprises means forming thermal short-circuits between the first element 4 comprising phase-change material and the second element 6 comprising phase-change material.

In addition, in FIG. 2A a practical example embodiment of the elements 4, 6 comprising phase-change materials, and more particularly enclosures, can be seen.

In this example each enclosure comprises an outer wall 19, for example made of glass of the Pyrex® type, and means to transfer the heat between the phase-change material and the thermoelement. The thermal conductivity of the enclosure is low, and preferably less than that of the MCP.

In the represented example the heat transfer means comprise an external part 18 and an internal part 20, which are interlocking. Parts 18, 20 comprise a plate 18.1 and fins 22 protruding from one of the faces of plate 18.1. The parts are manufactured from a material providing satisfactory thermal conductivity, such as aluminium or copper.

Fins 22 have, for example, a triangular section. The function of fins 22 is to develop a higher thermal exchange area between the phase-change material and the external environment. The parts are characterised by their "surface layout" factor, which is equal to the ratio of the area of a part with fins to the area of a part without fins. For example, a development factor 2 enables the storage power density of the phase-change material to be doubled. Parts having will preferably be chosen. In FIG. 2A the development factor of the parts is of the order of 6.

The two parts 18, 20 are interlocking, such that a fin 22 of a part 18, 20 is received between two fins 22 of the other part 20, 18. These two parts 18, then define a cavity 24 with a zigzag section. The flat face of plate 18.1 of external part 18 of the first element 4 comprising phase-change material receives heat flux F from heat source 15, and the flat face of internal part 20 of the first element 2 comprising phase-change material and the flat face of internal part 20 are in contact with thermoelement 2.

Fins 22 of internal parts 20 form fins conducting the heat from the MCP1 material to thermoelement 2, and then from thermoelement 2 to the MCP2 material.

In the case of element 4 comprising phase-change material located on the side of heat source 15, fins 22 of external part 18 are also used to conduct the heat from heat source 15 to the MCP1 material.

Internal parts 20 are, for example, cemented on to the faces of thermoelement 2 to ensure satisfactory thermal conduction.

The assembly between the external wall and the two parts 18, 20 is sealed against the phase-change materials by conventional means known to the skilled man in the art.

The MCP1 material is for example RT58®, the phase-change temperature of which is 58° C., and the MCP2 material is RT35H®, the phase-change temperature of which is 35° C., from the company Rubitherm®.

For the sake of simplicity of construction the two enclosures are identical; however, with respect to the enclosure containing the MCP2 material, it is possible for it not to have fins 22 in the area of external part 18, since it is not desired that the heat should be conducted to the exterior of the thermogenerator.

The thickness of the phase-change materials is advantageously roughly constant in each of the enclosures. This thickness is equal to the distance separating the faces opposite two adjacent fins 22, which forms two thermal exchange surfaces with the phase-change material.

The average thickness of the phase-change material is equal to a characteristic length Lc.

In a particularly advantageous manner, characteristic length Lc is of the order of, and preferably less than or equal to, the distance covered by the melt front. The term "of the order of" is understood to mean that a difference of 30% more or less is tolerated. The heat transmitted by fins 22 can thus traverse the material all the way through, and melt it completely in a given period of time dependent on the heat source.

The melt front distance is given by the following relationship:

$$\text{Melt front distance} = \sqrt{\frac{2 \cdot k \cdot \Delta T \cdot t}{L}}$$

where:
k: thermal conduction,
L: latent heat of fusion of the MCP,
ΔT: temperature difference between the temperature of the wall of the fins and the phase-change temperature of the MCP,
t: time.

The storage power of a phase-change material is given by the following relationship:

$$\text{Storage power} = \sqrt{\frac{L \cdot k \cdot \Delta T}{2t}}$$

The melt front distance consequently depends on the storage power and the time.

In the table below, different melt front distance values are grouped together according to storage power and time, assuming that the MCP1 and MCP2 materials have a thermal conduction equal to 0.2 W/m/K, and that the heat source is at a temperature of 100° C.

| | Storage | | | |
|---|---|---|---|---|
| | 400 W/m² | | 1000 W/m² | |
| | experiment time | | | |
| $L_c$ | 0.2 hr | 1.0 hr | 0.1 hr | 0.2 hr |
| MCP1 ΔT 100° C. − 58° C. | 0.9 cm | 2.0 cm | 0.6 cm | 0.9 cm |
| MCP2 ΔT = 58° C. − 35° C. | 0.7 cm | 1.5 cm | 0.4 cm | 0.7 cm |

Depending on the thermogenerator's operating conditions, the maximum advantageous thickness of the phase-change materials in the enclosures can be calculated.

It is clearly understood that it is absolutely not necessary that both materials should have the same thermal conductivity. They may be chosen to be different; in this case the thicknesses of the two phase-change materials in the two enclosures would be different.

We shall now describe in detail thermal short-circuit means 16.

In FIGS. 3A to 3C an example of such thermal short-circuit means 16 can be seen in three different states.

In this example, thermal short-circuit means 16 comprise one or more ducts 26 linking the interior of the tank of MCP1 material to the tank of MCP2 material. In the represented example the thermogenerator comprises two ducts 26. When the MCP1 and MCP2 materials are in the solid state, the portion of the duct on the side of the enclosure containing the MCP1 material, the upper portion in the representation of 2A, is filled with MCP1 material, and the portion of the duct on the side of the enclosure containing the MCP2 material, the lower portion in the representation of FIG. 2A, is filled with MCP2 material. A volume 28 filled with gas, for example air, is present between the two MCP1, MCP2 materials in the solid state.

Advantageously, duct 26 is made of a material having satisfactory thermal conductivity; it is made, for example, of metal, for example aluminium or copper.

Even more advantageously, the central portion of the duct extending between at least the MCP1 material-air or liquid interface and at least the air or liquid and MCP2 material interface, has low thermal conductivity, such that most of the heat, for example of the order of at least 90%, passes through the phase-change materials, and not through the wall of the duct. For example, this duct portion is made of a material having thermal conductivity lower than that of the phase-change materials, for example such as a plastic material or a glass, and/or is thin, in order to provide a small section for the heat flux. For example, this central portion can represent between 10% and 30% of the total length of the duct.

The thermogenerator according to this embodiment can also comprise several ducts 26 distributed between the enclosures containing the MCP1, MCP2 materials.

The thermogenerator can also comprise several ducts positioned next to one another.

When the MCP1 material melts it expands and comes into contact with the MCP2 material, to which it transmits heat, causing it to melt. The MCP1 and MCP2 materials are chosen such that they are not miscible.

In a particularly advantageous manner, the transverse dimension of duct 26, i.e. its diameter in the case of a duct of circular section, is less than characteristic dimension Lc, in order that complete melting of phase-change material MCP1 in the duct occurs rapidly, particularly in its centre. The melt front distance is equal to the distance travelled by the melt front over a given time. By choosing to make the diameter of the duct less than this distance, the melt front will have travelled the diameter of the tube; it can then be certain that all the MCP1 material in the duct has melted.

The examples of dimensions given above also apply for the dimensioning of the ducts. Depending on the operating conditions of the thermogenerator, it is thus possible to calculate the maximum advantageous diameter for the duct linking the two enclosures.

The ratio between the volume of MCP2 material contained in the duct and the volume of MCP2 material in the enclosure is advantageously less than 30%, preferably less than 20%, and even more preferably of the order of 2 to 15%.

We shall now explain the operation of this thermogenerator, assuming that the MCP1, MCP2 materials are solid.

When the element comprising phase-change material MCP1 is subjected to a heat source, phase-change material MCP1 begins to melt, and the MCP1 material located in duct 26 also begins to melt (FIG. 3A). During melting the MCP1 material is at constant temperature $T_{f1}$. It then comes into contact with the MCP2 material located in the duct (FIG. 3B). A small quantity of heat is then transmitted between the MCP1 material and the MCP2 material in the duct; and the latter begins to melt (FIG. 3C). Material MCP2 is then at constant temperature $T_{f2}$.

By virtue of these thermal short-circuit means 16, the appearance of the first nucleus of liquid of material MCP2 is thus caused more rapidly, whatever the thermal resistance formed by the thermoelement, without however accelerating the complete melting of all the MCP2 material. As soon as the first nucleus of liquid of MCP2 material appears the MCP2 material is at temperature $T_{f2}$ until the final nucleus of solid MCP2 material disappears. The period during which both the MCP1, MCP2 materials are at constant temperatures is consequently extended.

This then prevents all the MCP1 material, or a large proportion of it, from melting before the MCP2 material melts. This is achieved by short-circuiting the thermal resistance formed by the thermoelement.

These thermal short-circuit means enable a nucleus of liquid of MCP2 material to be created rapidly, without however reducing the volume of MCP2 material involved in the creation of the thermal gradient, since the materials used in the duct are added, and do not contribute in all cases to the creation of the thermal gradient. This quantity of material is not "seen" by the thermoelement.

It is clearly understood that the different ducts may have different diameters from one another; complete melting in the ducts having the largest diameters would thus occur later than in the ducts having the smallest diameters. One or more ducts having a variable diameter can also be envisaged. This variant enables a system having a flexible response to be obtained: if the duct section increases it will thus be possible to short-circuit greater power values or source times (see the data in the table above) for the same device.

In FIGS. 4A to 4C, a variant of the short-circuit means between the two enclosures can be seen. In this variant volume 28 between the two materials is partially filled with a liquid 30, for example water. This liquid is miscible neither with the MCP1 material, nor with the MCP2 material. Due to its deformability, volume of liquid 30 provides a satisfactory interface between the melted MCP1 material and the MCP2 material which has not yet melted.

The operation of these short-circuit means is similar to that of means represented in FIGS. 3A to 3C, and will not be repeated here.

The thermogenerator according to the present invention also advantageously comprises means to delay the complete solidification of the MCP1 material, which is the material having the higher melting point $T_{f1}$.

The means to delay the complete solidification of the MCP1 material are formed by an area containing MCP1 material, the dimensions of which, and in particular the dimension of which between two internal surfaces of the enclosure, is greater than those of the remainder of the enclosure.

For example, in the case of the thermogenerator of FIG. 2A the zigzag-shaped cavity may comprise an area in which the distance between two fins of the two parts 18, 20 defining a channel is greater than characteristic dimension Lc, for example twice as great, or more. As a variant, the enclosure may comprise an additional added tank, the transverse dimension of which is greater than the characteristic dimension.

The ratio between the volume of the portion of MCP1 material the thickness of which is greater than the melt front distance and the total volume of MCP1 material is advantageously less than 30%, preferably less than 20%, and even more preferably of the order of 2 to 15%.

We shall now explain the operation of this thermogenerator, assuming that the MCP1, MCP2 materials are originally liquid.

If no heat source is present the enclosures cool, and indeed fins 22 also, which causes the temperature of the MCP1 and MCP2 materials to drop.

Since the MCP1 material is the one which has the higher melting point it solidifies first.

While the solidification of the MCP1 material is occurring, and liquid phase exists, the temperature of the MCP1 material is at temperature $T_{f1}$. The temperature gradient through the thermoelement is therefore constant. By comprising this area of greater dimension, solidification of the MCP1 material in this area is delayed compared to the remainder of the MCP1 material. Existence of a liquid phase of the MCP1 material is therefore extended, together therefore with the maintenance of a constant temperature $T_{f1}$, and together therefore with the maintenance of a constant temperature gradient.

In FIG. 5 another method of operation of a thermogenerator according to the present invention associated with a fluid circuit can be seen.

Unlike the thermogenerators of FIGS. 1 and 2A, the heat source does not directly radiate the first element comprising phase-change material, but exchanges heat with a fluid circuit 32, in which a heat transfer fluid flows.

The heat source is located downstream from second element 6 comprising phase-change material, and upstream from element 4 comprising phase-change material in the direction of flow of the heat transfer fluid. Fluid circuit 32 forms a closed loop, and traverses the second element 6 comprising phase-change material, hot source 15 and first element 4 comprising phase-change material. The temperature of the heat transfer fluid is at least equal to the temperature of phase-change material MCP2.

The enclosures of the phase-change elements are such that they delimit cavities for phase-change materials MCP1 and MCP2, and channels for the sealed flow of the heat transfer fluid. Tubes traversing in sealed fashion the enclosures of elements 4, 6 comprising phase-change materials may be comprised.

The hot source is, for example, an integrated circuit in a computer.

We shall now explain the operation of the circuit of FIG. 5.

The "cold" heat transfer fluid traverses the second element comprising phase-change material, and causes a partial melting of the MCP2 material. It then traverses the hot source in which the heat transfer fluid is heated to a temperature at least equal to $T_{f1}$. The heated heat transfer fluid then traverses the first element comprising phase-change material, causing the partial melting of the MCP1 material. The heat transfer fluid is then cooled, and then returned to the second element comprising phase-change material.

As long as the heat transfer fluid flows in the circuit the MCP1 and MCP2 materials are in a state of solid-liquid phase transition. The temperature of each of the elements comprising phase-change materials is constant, as is, indeed, the temperature gradient applied to the thermoelement. The thermogenerator then generates stable electrical power.

The system of FIG. 5 is particularly suitable for cooling integrated circuits of a computer, since the heat extracted in this manner enables electricity to be generated which can be used by the computer. For as long as the computer operates the heat transfer fluid flows in circuit 32 and keeps the MCP1, MCP2 materials in a transient phase-change state.

Since the properties of the phase-change materials are reversible, as can be seen in FIG. 6, stable electrical energy can be generated in cyclical fashion, by virtue of the invention, in accordance with the cyclical operation of the heat source: alternation of periods of emissions of heat (heating and melting of the MCP1 and MCP2 materials) and of periods of non-emission of heat (cooling and solidification of the MCP1 and MCP2 materials).

It is clearly understood that the thermogenerator according to the invention can comprise several thermoelements connected electrically in series or in parallel, depending on the application. The thermoelements are connected thermally in parallel. The thermoelements are positioned next to one another between the two elements comprising phase-change materials.

The phase-change materials which can be used in the present invention can be organic materials such as RT100® of Rubitherm® the phase-change temperature of which is 99° C., benzoic acid, the phase-change temperature of which is 122° C., benzamide, the phase-change temperature of which is 130° C., stilbene, the phase-change temperature of which is 123° C., erythritol, the phase-change temperature of which is 118° C., etc.), hydrates of salts such as $MgCl_2.6H_2O$, the phase-change temperature of which is 117° C., salts such as $KNO_3$—$NaNO_2$—$NaNO_3$, the phase-change temperature of which is 140° C., $NaNO_3$—$KNO_3$, the phase-change temperature of which is 222° C., etc., or metals such as Sn, the phase-change temperature of which is 232° C., etc.

Pairs of phase-change materials MCP1 and MCP2 having a substantial temperature difference will preferably be chosen, which will be advantageous for the generated electrical power.

The invention claimed is:

1. A thermogenerator comprising:
    at least one thermoelement and two phase-change materials having different phase-change temperatures,
    the at least one thermoelement having two opposite main faces, and each of the faces being covered by one of the phase-change materials, such that the thermoelement is subject only to a temperature gradient imposed by the two phase-change material, during a phase of heating or cooling.

2. A thermogenerator according to claim 1, further comprising enclosures containing the phase-change materials, each enclosure including a first and a second part, the first part comprising a flat plate, one face of which includes first protruding fins, and the second part comprising a flat plane, one face of which is in contact with the thermoelement, and the other face of which includes second protruding fins, the first and second parts being installed facing one another, such that the first and second fins interpenetrate, defining a cavity in which the phase-change material is present.

3. A thermogenerator according to claim 2, in which thickness of the phase-change material in at least a proportion of each of the enclosures is of an order of a melt front distance, the melt front distance being equal to $$\sqrt{\frac{2 \cdot k \cdot \Delta T \cdot t}{L}},$$

wherein k is thermal conduction of the phase-change material, L is latent heat of fusion of the phase-change material, $\Delta T$ is temperature difference between the temperature of the wall of the fin and the phase-change temperature of the phase-change material, and t is time.

4. A thermogenerator according to claim 1, further comprising means to bring the two phase-change materials into direct contact.

5. A thermogenerator according to claim 4, in which the means bringing the two phase-change materials into direct contact comprises at least one duct connecting an enclosure in which the first phase-change material is present and an enclosure in which the second phase-change material is present, the duct being partially filled by the first phase-change material and by the second phase-change material.

6. A thermogenerator according to claim 5, in which transverse dimension of the duct is less than or equal to a melt front distance, wherein the melt front distance is equal to $$\sqrt{\frac{2 \cdot k \cdot \Delta T \cdot t}{L}},$$

wherein k is thermal conduction of the phase-change material, L is latent heat of fusion of the phase-change material, $\Delta T$ is temperature difference between the temperature of the wall of the duct and the phase-change temperature of the phase-change material, and t is time.

7. A thermogenerator according to claim 5, in which at least one volume of liquid separates the first and second phase-change materials in the duct.

8. A thermogenerator according to claim 6, in which at least one volume of liquid separates the first and second phase-change materials in the duct.

9. A thermogenerator according to claim 1, further comprising enclosures containing the phase-change materials, the enclosure containing the phase-change material having higher phase-change temperature comprising an area of phase-change material, a thickness of which is greater than a melt front distance.

10. A thermogenerator according to claim 9, further each enclosure including a first and a second part, the first part comprising a flat plate, one face of which includes first protruding fins, and the second part comprising a flat plane, one face of which is in contact with the thermoelement, and the other face of which includes second protruding fins, the first and second parts being installed facing one another, such that the first and second fins interpenetrate, defining a cavity in which the phase-change material is present and in which the distance between two fins is locally greater than the melt front distance.

11. A thermogenerator according to claim 9, in which the enclosure comprise an added tank containing phase-change material, transverse dimension of the tank being greater than the melt front distance.

12. A thermogenerator according to claim 1, surrounded by thermal insulation to guide heat flux through a stack formed by the phase-change materials and the at least one thermoelement.

13. An electricity generating system comprising a thermogenerator according to claim 1 and a heat source.

14. An electricity generating system according to claim 13, in which the heat source is positioned on a side of the enclosure containing the phase-change material having the higher phase-change temperature.

15. An electricity generating system according to claim 13, comprising a closed fluid circuit, containing a heat-transfer fluid, the circuit configured to exchange heat with the first and second phase-change materials, and traversing the heat source, in which the heat source is located downstream from the phase-change material having the lower phase-change temperature, and upstream from the phase-change material having the higher phase-change temperature in the direction of flow of the heat transfer fluid, and in which, when the heat transfer fluid exchanges with the phase-change material having the lower phase-change temperature, its temperature is at least equal to the phase-change temperature of the material, and when the heat transfer fluid exchanges heat with the phase-change material having the higher phase-change temperature, its temperature is at least equal to the phase-change temperature of said material.

16. An electricity generating system according to claim 13, in which the heat source is formed by at least one integrated circuit.

\* \* \* \* \*